(12) United States Patent
Okuno

(10) Patent No.: US 7,513,263 B2
(45) Date of Patent: Apr. 7, 2009

(54) SUBSTRATE HOLDING DEVICE AND SUBSTRATE PROCESSING APPARATUS

(75) Inventor: Eiji Okuno, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 186 days.

(21) Appl. No.: 11/248,056

(22) Filed: Oct. 11, 2005

(65) Prior Publication Data
US 2006/0081274 A1     Apr. 20, 2006

(30) Foreign Application Priority Data
Oct. 18, 2004   (JP)   ............................. 2004-303417

(51) Int. Cl.
*B08B 3/04*   (2006.01)
(52) U.S. Cl. ..................................... 134/148
(58) Field of Classification Search ................. 134/148
See application file for complete search history.

(56) References Cited

U.S. PATENT DOCUMENTS

| | | | | |
|---|---|---|---|---|
| 5,163,651 A | * | 11/1992 | Matsumoto | 248/425 |
| 5,685,232 A | * | 11/1997 | Inoue | 108/20 |
| 6,632,292 B1 | * | 10/2003 | Aegerter et al. | 134/33 |
| 6,644,855 B2 | * | 11/2003 | Sakino et al. | 384/9 |

FOREIGN PATENT DOCUMENTS

| | | |
|---|---|---|
| JP | 06-60691 | 8/1994 |
| JP | 2002-110630 | 4/2002 |

OTHER PUBLICATIONS

Translation of Kumaoka Seiichi (JP 04-000073).*

* cited by examiner

*Primary Examiner*—Frankie L Stinson
*Assistant Examiner*—Samuel A Waldbaum
(74) *Attorney, Agent, or Firm*—Ostrolenk, Faber, Gerb & Soffen, LLP

(57) ABSTRACT

A substrate holding device according to the present invention comprises: a motor; a rotating shaft rotated by the driving force of the motor; a spin base coupled to the rotating shaft and rotated integrally with the rotating shaft; a cover member surrounding the motor and having its one end arranged in the vicinity of the spin base; a rotating ring fixed to a surface, opposite to the cover member, of the spin base; a fixed ring arranged opposite to the rotating ring along the axis of the rotating shaft; a spring provided at the one end of the cover member for elastically urging the fixed ring toward the rotating ring; and clean gas supply mechanism for supplying clean gas to a space between the rotating ring and the fixed ring. Either one of a surface, opposite to the fixed ring, of the rotating ring and a surface, opposite to the rotating ring, of the fixed ring is formed with a gas introducing recess into which the clean gas is to be introduced by the clean gas supply mechanism, and either one of the opposite surfaces being formed with a dynamic pressure creating recess for creating the dynamic pressure of the gas between the rotating ring and the fixed ring when the rotating ring rotates.

5 Claims, 3 Drawing Sheets

SUBSTRATE HOLDING DEVICE AND SUBSTRATE PROCESSING APPARATUS

BACKGROUND OF THE INVENTION

1. Field of the Invention

The present invention relates to a substrate holding device for holding a substrate such as a semiconductor wafer or a glass substrate for a liquid crystal display device, and a substrate processing apparatus comprising the same.

2. Description of Related Art

A single substrate processing apparatus used in the manufacturing process of a semiconductor device, for example, comprises a spin chuck for holding a substrate almost horizontally and rotating the held substrate, and a nozzle for supplying a process liquid such as a chemical liquid to the substrate held in the spin chuck. In the single substrate processing apparatus, process of the substrate using the process liquid is achieved by supplying, while rotating the substrate within a horizontal surface using the spin chuck, the process liquid from the nozzle to the substrate that is being rotated.

The spin chuck comprises a rotating shaft arranged in a vertical direction, a spin base mounted on an upper end of the rotating shaft almost horizontally, and a plurality of chuck pins arranged on an upper surface of the spin base. The rotating shaft is integrated with a driving shaft of a motor. The rotating shaft is rotated by the motor with the substrate held by the plurality of chuck pins, so that the substrate, together with the spin base, is rotated.

The motor is surrounded by a cylindrical cover member. In order to prevent a corrosive atmosphere including a process liquid component from reaching to a rotation mechanism section including the motor or the like and prevent an atmosphere including dust (particles) generated from the rotation mechanism section from reaching to the substrate, an upper end of the cover member leads to the vicinity of a lower surface of the spin base, and a sealing mechanism is arranged between the upper end of the cover member and the lower surface of the spin base.

It is considered that a contact seal such as an oil seal is used, for example, for the sealing mechanism. However, the contact seal may cause generation of dust and reduction in sealing properties by abrasion. Since the diameter of the cover member surrounding the motor is relatively large, the diameter of the contact seal provided along the upper end of the cover member also becomes large. When the spin base is rotated, therefore, the peripheral speed of a contact portion with the contact seal on the lower surface of the spin base is increased so that the contact seal may be baked.

In order to avoid such a problem caused by using the contact seal, a so-called non-contact static pressure-type seal may, in some cases, be used. The non-contact static pressure-type seal comprises a fixed ring supported on an upper end surface of the cover member through a plurality of springs, and a rotating ring mounted on the lower surface of the spin base and arranged opposite to the fixed ring. A plurality of clean gas blow-off ports open to an upper surface of the fixed ring. Clean gas can be supplied to a space between the fixed ring and the rotating ring from the clean gas blow-off ports. In a state where no clean gas is supplied from the clean gas blow-off ports, the fixed ring is abutted against the rotating ring over its entire periphery by the urging force of the springs. When clean gas is supplied to a space between the fixed ring and the rotating ring from the clean gas blow-off ports, the fixed ring is spaced apart from the rotating ring by several micrometers to tens of micrometers by the pressure (static pressure) of the clean gas, thereby entering a non-contact state. At this time, the clean gas supplied to the space between the fixed ring and the rotating ring branches off to flow along the inside and the outside of the cover member from the space. Consequently, sealing between the fixed ring and the rotating ring is achieved.

While the substrate (spin base) is being rotated, the clean gas continues to be supplied to the space between the fixed ring and the rotating ring in order to maintain the non-contact state between the fixed ring and the rotating ring. However, the flow rate of the clean gas supplied to the space between the fixed ring and the rotating ring may be reduced due to a failure in a clean gas piping system or a clean gas supply source, for example. When the flow rate of the clean gas is reduced, the pressure of the clean gas between the fixed ring and the rotating ring is reduced, whereby the rotating ring rotates while coming into contact with the fixed ring. Therefore, the fixed ring and/or the rotating ring may be damaged, and atmospheric contamination with abrasion powder of the fixed ring and/or the rotating ring may be occurred. Even if interlocking control for stopping the driving of the motor to stop the process of the substrate in response to the reduction in the flow rate of the clean gas is carried out, the rotating ring rotates while coming into contact with the fixed ring for approximately three seconds from the stop of the driving of the motor to the stop of the rotation of the spin base. Therefore, the same problem occurs. When such a problem occurs, cleaning for removing the abrasion powder must be performed in addition to the repair of a faulty portion. As a result, a down time period (a time period during which the substrate cannot be processed) by the substrate processing apparatus is lengthened.

In a configuration using a non-contact static pressure-type seal, the clean gas must continue to be supplied to the space between the fixed ring and the rotating ring while the substrate is being rotated. Therefore, the running cost is high.

SUMMARY OF THE INVENTION

An object of the present invention is to provide a substrate holding device and a substrate processing apparatus capable of continuing to maintain a non-contact state between a fixed ring and a rotating ring even when the supply flow rate of clean gas is reduced in a configuration using a non-contact seal and capable of preventing damages to the fixed ring and the rotating ring and atmospheric contamination with abrasion powder and a substrate processing apparatus comprising the same.

A substrate holding device according to the present invention is a substrate holding device for holding a substrate and rotating the held substrate, which comprises: a motor; a rotating shaft rotated by the driving force of the motor; a spin base coupled to the rotating shaft and rotated integrally with the rotating shaft; a cover member surrounding the motor and having its one end arranged in the vicinity of the spin base; a rotating ring fixed to a surface, opposite to the cover member, of the spin base; a fixed ring arranged opposite to the rotating ring along the axis of the rotating shaft; a spring provided at the one end of the cover member for elastically urging the fixed ring toward the rotating ring; and clean gas supply mechanism for supplying clean gas to a space between the rotating ring and the fixed ring, either one of a surface, opposite to the fixed ring, of the rotating ring and a surface, opposite to the rotating ring, of the fixed ring being formed with a gas introducing recess into which the clean gas is to be introduced by the clean gas supply mechanism, and either one of the surface, opposite to the fixed ring, of the rotating ring and the surface, opposite to the rotating ring, of the fixed ring being formed with a dynamic pressure creating recess for creating the dynamic pressure of gas between the rotating ring and the fixed ring when the rotating ring rotates.

According to this configuration, if the clean gas is introduced into the gas introducing recess by the clean gas supply mechanism in a state where the motor is stopped, and the rotating shaft and the spin base stand still, a non-contact state where the fixed ring is spaced apart from the rotating ring against the urging force of the spring can be maintained by the static pressure of the clean gas introduced into the gas introducing recess. At this time, the space between the fixed ring and the rotating ring can be sealed with the clean gas branching off to flow along the outside and the inside in the radial direction of the rotating ring from the gas introducing recess. When the rotating shaft and the spin base stand still, therefore, a space within the cover member can be reliably cut off from a space outside thereof. Accordingly, it is possible to prevent an external atmosphere from reaching to the motor arranged within the cover member and prevent an atmosphere including particles within the cover member from reaching to the substrate.

Both the gas introducing recess and the dynamic pressure creating recess may be formed on the surface, opposite to the fixed ring, of the rotating ring or may be formed on the surface, opposite to the rotating ring, of the fixed ring. The gas introducing recess may be formed on the surface, opposite to the fixed ring, of the rotating ring, and the dynamic pressure creating recess may be formed on the surface, opposite to the rotating ring, of the fixed ring. Alternatively, the gas introducing recess may be formed on the surface, opposite to the rotating ring, of the fixed ring, and the dynamic pressure creating recess may be formed on the surface, to the fixed ring, of the rotating ring. That is, the gas introducing recess and the dynamic pressure creating recess may be formed on the same surface or may be respectively formed on the different surfaces.

In a state where the motor is driven so that the rotating shaft and the spin base are being rotated, the dynamic pressure of gas is created by the function of the dynamic pressure creating recess. Even if the supply flow rate of the clean gas by the clean gas supply mechanism is reduced because there occurs a failure or the like in a clean gas piping system or a clean gas supply source, for example, while the rotating shaft and the spin base are being rotated, therefore, a non-contact state where the fixed ring is spaced apart from the rotating ring against the urging force of the spring can be maintained by the dynamic pressure. Therefore, it is possible to prevent the fixed ring and/or the rotating ring from being damaged and to prevent atmospheric contamination with abrasion powder of the fixed ring and/or the rotating ring from being occurred. As a result, if the repair of a faulty portion is completed, the process of the substrate in the substrate processing apparatus comprising the substrate holding device can be immediately resumed, thereby allowing a down time period (a time period during which the process of the substrate cannot be performed) by the substrate processing apparatus to be shortened.

The gas introducing recess may be a groove extending along the circumference of the rotating ring or the fixed ring.

It is preferable that the dynamic pressure creating recess has such a slope that the depth thereof gradually decreases along the circumference of the rotating ring or the fixed ring. Since the dynamic pressure creating recess has such a slope, the pressure thereof can be increased as the clean gas flows into a shallow portion in the dynamic pressure creating recess in a state where the rotating shaft and the spin base are rotated.

It is preferable that the clean gas supply mechanism comprises a flow rate adjustment valve for adjusting the supply flow rate of the clean gas, and the substrate holding device further comprises a control section for controlling the opening degree of the flow rate adjustment valve in response to the rotation speed of the motor.

In this case, the opening degree of the flow rate adjustment valve is adjusted in response to the rotation speed of the motor, so that the flow rate of the clean gas to be supplied to the gas introducing recess by the clean gas supply mechanism is adjusted.

For example, the control section may open the flow rate adjustment valve at a relatively high opening degree when the rotation speed of the motor is lower than a predetermined dynamic pressure creation speed, while opening the flow rate adjustment valve at a relatively low opening degree when the rotation speed of the motor is not less than the dynamic pressure creation speed.

The dynamic pressure is created between the fixed ring and the rotating ring while the rotating shaft and the spin base are being rotated (the motor is being driven). Even if the supply flow rate of the clean gas by the gas supply mechanism is reduced, therefore, a state where the fixed ring is spaced apart from the rotating ring can be maintained by the dynamic pressure and the static pressure of the clean gas. Therefore, the supply flow rate of the clean gas by the gas supply mechanism is positively reduced while the rotating shaft and the spin base are being rotated. Accordingly, the consumption of the clean gas can be reduced, thereby allowing the running cost of the device to be reduced.

A substrate processing apparatus according to the present invention comprises a substrate holding device for holding a substrate and rotating the held substrate and a process liquid supply mechanism for supplying a process liquid to the substrate held in the substrate holding device, the substrate holding device comprising a motor, a rotating shaft rotated by the driving force of the motor, a spin base coupled to the rotating shaft and rotated integrally with the rotating shaft, a cover member surrounding the motor and having its one end arranged in the vicinity of the spin base, a rotating ring fixed to a surface, opposite to the cover member, of the spin base, a fixed ring arranged opposite to the rotating ring along the axis of the rotating shaft, a spring provided at the one end of the cover member for elastically urging the fixed ring toward the rotating ring, and clean gas supply mechanism for supplying clean gas to a space between the rotating ring and the fixed ring, either one of a surface, opposite to the fixed ring, of the rotating ring and a surface, opposite to the rotating ring, of the fixed ring being formed with a gas introducing recess into which the clean gas is to be introduced by the clean gas supply mechanism, and either one of the surface, opposite to the fixed ring, of the rotating ring and the surface, opposite to the fixed ring, of the rotating ring being formed with a dynamic pressure creating recess for creating the dynamic pressure of gas between the rotating ring and the fixed ring when the rotating ring rotates.

That is, the substrate processing apparatus according to the present invention comprises the above-mentioned substrate holding device and a process liquid supply mechanism for supplying a process liquid to the substrate held in the substrate holding device. Even if the supply flow rate of the clean gas by the clean gas supply mechanism is reduced while the rotating shaft and the spin base are being rotated, therefore, a non-contact state where the fixed ring is spaced apart from the rotating ring against the urging force of the spring. Accordingly, it is possible to prevent damage to the fixed ring and/or the rotating ring and atmospheric contamination with abrasion powder.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Figure 1:
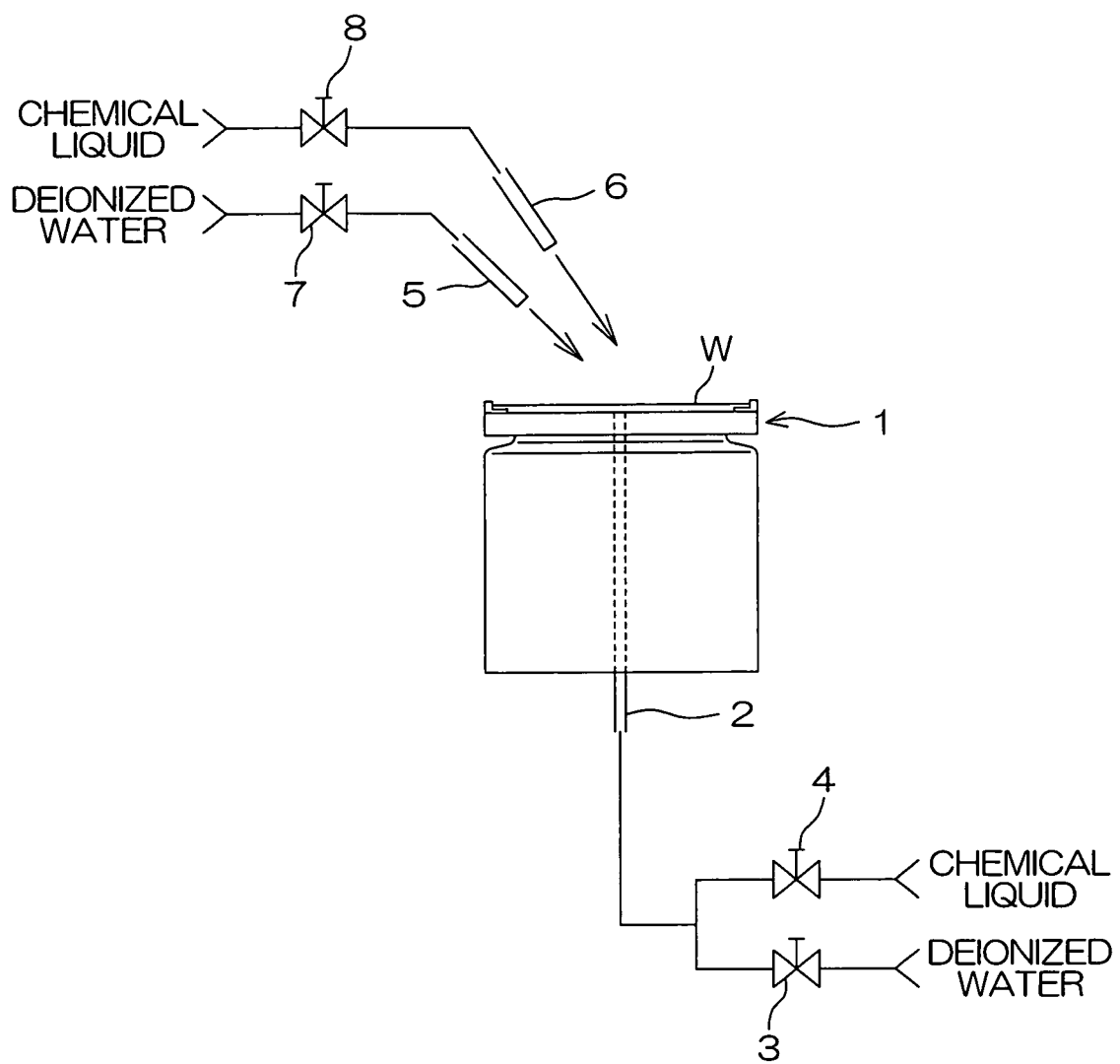
FIG. 1 is an illustration showing the configuration of a substrate processing apparatus comprising a substrate holding device according to an embodiment of the present invention.

FIG. 1 is an illustration showing the configuration of a substrate processing apparatus comprising a substrate holding device according to an embodiment of the present invention. The substrate processing apparatus comprises a spin chuck 1 serving as a substrate holding device for holding a semiconductor wafer (hereinafter merely referred to as a "wafer") W serving as an example of a substrate almost horizontally and rotating the wafer W around a vertical axis passing through an approximately central portion of the wafer W.

A process liquid supply pipe 2 is inserted into the spin chuck 1. The process liquid supply pipe 2 extends in a vertical direction. An upper end of the process liquid supply pipe 2 is coupled to a reverse nozzle 16 (see FIG. 2) arranged in close proximity to the center of a lower surface (reverse surface) of the wafer W held in the spin chuck 1. Deionized water from a deionized water supply source and a chemical liquid from a chemical liquid supply source are selectively supplied, respectively, to the process liquid supply pipe 2 through a deionized water valve 3 and a chemical liquid valve 4. The deionized water or the chemical liquid supplied to the process liquid supply pipe 2 is discharged from a discharge outlet of the reverse nozzle 16 toward the center on the lower surface of the wafer W held in the spin chuck 1.

A deionized water nozzle 5 for supplying deionized water to an upper surface (surface) of the wafer W held in the spin chuck 1 and a chemical liquid nozzle 6 for supplying a chemical liquid to the upper surface of the wafer W are arranged above the spin chuck 1. The deionized water from the deionized water supply source is supplied to the deionized water nozzle 5 through a deionized water valve 7. On the other hand, the chemical liquid from the chemical liquid supply source is supplied to the chemical liquid nozzle 6 through a chemical liquid valve 8.

Such a configuration allows the deionized water and/or the chemical liquid serving as a process liquid to be supplied to at least one of the upper surface and the lower surface of the wafer W while rotating the wafer W by the spin chuck 1.

Figure 2:
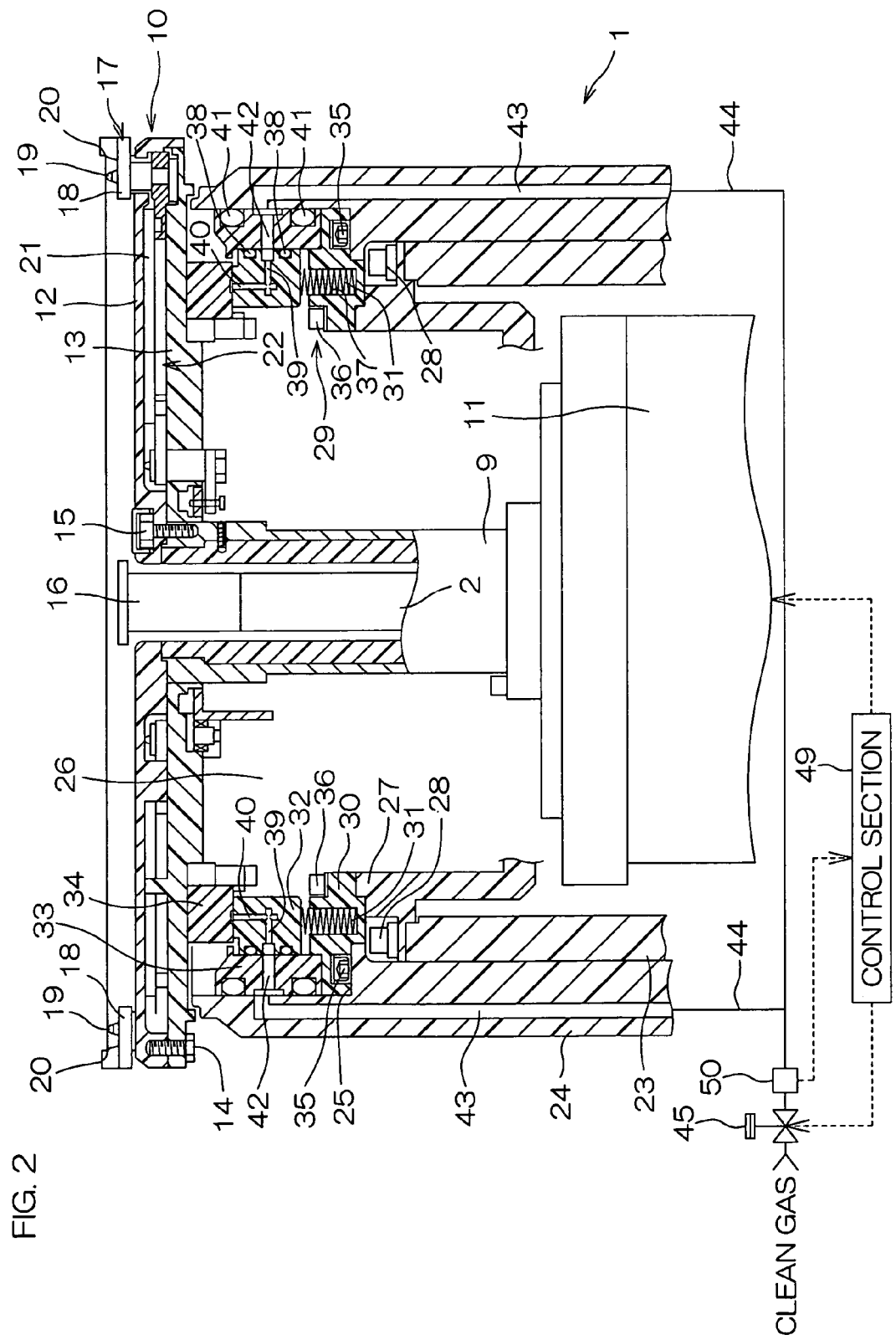
FIG. 2 is a vertical sectional view showing the internal configuration of a spin chuck.

FIG. 2 is a vertical sectional view showing the internal configuration of the spin chuck 1. The spin chuck 1 comprises a rotating shaft 9 arranged in a vertical direction, a spin base 10 in a disk shape fixed to an upper end of the rotating shaft 9, and a motor 11 arranged below the spin base 10.

The rotating shaft 9 is a hollow shaft integrated with a driving shaft of the motor 11. The process liquid supply pipe 2 is inserted into the rotating shaft 9.

The spin base 10 comprises an upper cover 12 in a disk shape and a lower cover 13 in the same disk shape. The upper cover 12 and the lower cover 13 are overlapped with each other and are fixed to each other using a bolt 14 at their peripheral edges. An insertion hole is formed in a central portion of each of the upper cover 12 and the lower cover 13. The spin base 10 is fixed to the rotating shaft 9 using a bolt 15. The rotating shaft 9 is inserted into the insertion hole of the lower cover 13 in the spin base 10, and the upper end thereof is connected to the periphery of the insertion hole on a lower surface of the upper cover 12. Further, the reverse nozzle 16 passes through each of the insertion holes of the upper cover 12 and the lower cover 13. A lower end of the reverse nozzle 16 extends into the rotating shaft 9. The lower end of the reverse nozzle 16 and an upper end of the process liquid supply pipe 2 are connected to each other within the rotating shaft 9.

On an upper surface of the spin base 10, a plurality of (three in the present embodiment) holding members 17 are arranged at approximately equal angular intervals at its peripheral edge. Each of the holding members 17 has a configuration in which a supporting section 19 in an approximately conical shape that comes into point contact with the lower surface at the peripheral edge of the wafer W and a columnar regulating section 20 for regulating an end surface of the wafer W are provided upright. The holding members 17 are interlocked with one another so as to abut each of the regulating sections 20 against the peripheral edge of the wafer W to hold the wafer W. Further, the holding members 17 are interlocked with each other so as to retreat each of the regulating sections 20 from the peripheral edge of the wafer W to release the holding of the wafer W. A link mechanism 22 for interlocking the holding members 17 with each other is contained within a containing space 21 defined by the upper cover 12 and the lower cover 13.

Around the motor 11, a casing 23 is arranged so as to surround the motor 11. The casing 23 is further surrounded by a cylindrical cover member 24. An upper end of the cover member 24 leads to the vicinity of the lower cover 13 in the spin base 10. A stepped surface 25 opposed to the lower cover 13 so as to be almost parallel thereto is formed on an inner surface in the vicinity of the upper end of the cover member 24. Further, a mechanism section supporting member 27 for supporting a predetermined mechanism section (not shown) arranged within a motor containing space 26 surrounded by the cover member 24 is fixed using a bolt 28 to an upper end of the casing 23.

Between the stepped surface 25 of the cover member 24 and an upper surface of the mechanism section supporting member 27 and the lower cover 13 in the spin base 10, a dynamic pressure/static pressure combined-type sealing mechanism 29 for sealing a space formed therebetween and cutting off the motor containing space 26 in the cover member 24 from an external atmosphere (an atmosphere of a space containing the wafer W to be processed) is arranged.

The dynamic pressure/static pressure combined-type sealing mechanism 29 comprises an annular base 30 arranged so as to stretch over both the stepped surface 25 of the cover member 24 and the upper surface of the mechanism section supporting member 27, an annular fixed ring 32 supported on the base 30 through a plurality of (e.g., 16) springs 31, a spacer 33 arranged between the fixed ring 32 and an inner surface of the cover member 24, and an annular rotating ring 34 mounted on a lower surface of the lower cover 13 in the spin base 10 and arranged opposite to the fixed ring 32.

The base 30 is fixed to the stepped surface 25 of the cover member 24 by a bolt 35, and is fixed to the upper surface of the mechanism section supporting member 27 by a bolt 36. Further, a plurality of columnar recesses 37 concaved downwardly are formed at approximately equal angular intervals in the base 30. The spring 31 is arranged in each of the recesses 37.

Respective upper ends of the plurality of springs 31 are connected to a lower surface of the fixed ring 32, so that the fixed ring 32 is elastically supported on the base 30. An outer peripheral surface of the fixed ring 32 is brought into contact with an inner peripheral surface of the spacer 33. Two O rings 38 for sealing a space between the outer peripheral surface of the fixed ring 32 and the spacer 33 are embedded in the outer peripheral surface of the fixed ring 32. Inside the fixed ring 32, a gas horizontal path 39 extending in a horizontal direction (along the radius of gyration of the wafer W) from the outer peripheral surface of the fixed ring 32, and a gas vertical path 40 connected to a front end of the gas horizontal path 39 and extending vertically toward an upper surface of the fixed ring 32 from its connected portion are formed. A plurality of (e.g., seven) sets of gas horizontal paths 39 and gas vertical paths 40 are formed at approximately equal angular intervals in the circumferential direction. A front end (an upper end) of each of the gas vertical paths 40 opens on the upper surface of the fixed ring 32.

An outer peripheral surface of the spacer 33 is in contact with an inner peripheral surface of the cover member 24. Two O rings 41 for sealing a space between the outer peripheral surface of the spacer 33 and the inner peripheral surface of the cover member 24 are embedded in the outer peripheral surface of the spacer 33. A communicating path 42 communicating with each of the gas horizontal paths 39 penetrates the spacer 33 in a horizontal direction. On the other hand, a gas supply path 43 communicating with each of the communicating paths 42 is formed inside the cover member 24. Clean gas such as nitrogen gas or clean air is supplied from a gas supply source (not shown) to the gas supply paths 43 through gas supply pipings 44, respectively. The gas supply pipings 44 are collected together halfway and are connected to the gas supply source, and a flow rate adjustment valve 45 for adjusting the flow rate of the clean gas supplied from the gas supply source is held in their collected portion.

Figure 3:
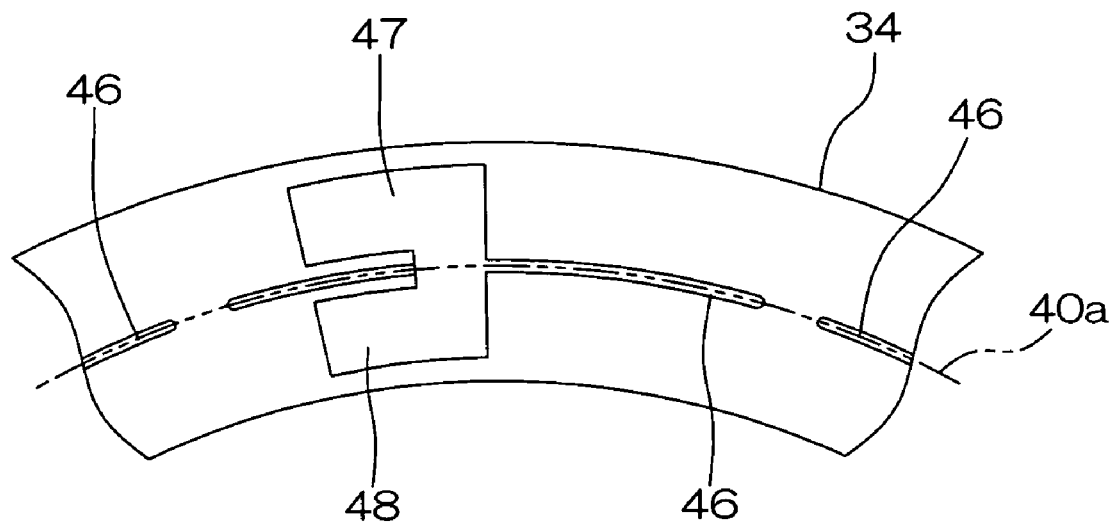
FIG. 3 is a bottom view showing a principal part of a rotating ring.

On a lower surface of the rotating ring 34, circular arc-shaped gas introducing grooves 46 extending along the circumference of the rotating ring 34 are respectively formed at positions where openings at front ends of the gas vertical paths 40 in the fixed ring 32 are opposed to a trace 40a drawn when the rotating ring 34 rotates. A dynamic pressure creating groove 47 is formed on the lower surface of the rotating ring 34. The dynamic pressure creating groove 47 is formed in an L shape extending outward along the radius of the rotating ring 34 from a substantially central portion in the longitudinal direction (in the circumferential direction) of each of the gas introducing grooves 46 and extending while being bent in the circumferential direction (counterclockwise in FIG. 3). A dynamic pressure creating groove 48 is formed on the lower surface of the rotating ring 34. The dynamic pressure creating groove 48 is formed in an L shape extending inward along the radius of the rotating ring 34 from a central portion in the longitudinal direction (in the circumferential direction) of each of the gas introducing grooves 46 and extending while being bent in the circumferential direction (counterclockwise in FIG. 3). Each of the dynamic pressure creating grooves 47 and 48 is sloped such that the depth thereof gradually decreases as it moves farther away from its bent portion in the circumferential direction.

As shown in FIG. 2, the spin chuck 1 comprises a control section 49 having a configuration including a CPU, a RAM, and a ROM. A flow rate sensor 50 for detecting the supply flow rate of clean gas from the gas supply source is connected to the control section 49. The control section 49 controls the driving of the motor 11. The control section 49 controls the opening degree of the flow rate adjustment valve 45 on the basis of the rotation speed of the motor 11 and the results of the detection by the flow rate sensor 50.

Specifically, in a state where the motor 11 is stopped so that the rotating shaft 9 and the spin base 10 stand still, the control section 49 controls the opening degree of the flow rate adjustment valve 45 such that the supply flow rate of the clean gas from the gas supply source is 30 litters per minute, for example. Consequently, the clean gas is vigorously supplied to the gas supply pipings 44. The clean gas flows through the communication path 42, gas horizontal path 39, and gas vertical path 40 from each of the gas supply pipings 44, and is vigorously discharged into the gas introducing grooves 46 formed on the lower surface of the rotating ring 34 from the opening at the front end of the gas vertical path 40. A non-contact state where the fixed ring 32 is spaced apart from the lower surface of the rotating ring 34 by approximately 5 to 20 μm against the urging force of the spring 31 by the pressure (static pressure) of the clean gas discharged into each of the gas introducing grooves 46 is maintained. At this time, a space between the fixed ring 32 and the rotating ring 34 is sealed with the clean gas branching off to flow along the outside and the inside in the radial direction of the rotating ring 34 from each of the gas introducing grooves 46. When the rotating shaft 9 and the spin base 10 stand still, therefore, the motor containing space 26 within the cover member 24 can be reliably cut off from a space outside thereof. Accordingly, it is possible to prevent an external atmosphere including a process liquid component from reaching to the motor 11 arranged within the motor containing space 26 and the other mechanism section and to prevent an atmosphere including particles within the motor containing space 26 from reaching to the wafer W.

At the time of process for the wafer W, the control section 49 drives the motor 11 at a predetermined rotation speed. After the driving of the motor 11 is started, the clean gas also continues to be supplied from the gas supply source at a flow rate of 30 litters per minute. When the rotation speed of the motor 11 reaches a predetermined dynamic pressure creation speed (e.g., 100 rpm) while the driving of the motor 11 is being raised, the control section 49 reduces the supply flow rate of the clean gas from the gas supply source from 30 litters per minute to 15 litters per minute, for example.

When the driving of the motor 11 is started so that the rotating shaft 9 and the spin base 10 start to rotate in one direction, a part of the clean gas supplied to each of the gas introducing grooves 46 flows from the gas introducing groove 46 along the dynamic pressure creating grooves 47 and 48 respectively having portions extending toward the upstream side in the rotation direction thereof. Since a bottom surface of each of the dynamic pressure creating grooves 47 and 48 is sloped, the pressure of the clean gas flowing through the dynamic pressure creating grooves 47 and 48 is increased as the clean gas flows toward the upstream side in the rotation direction. As a result, the dynamic pressure of the clean gas is created between the fixed ring 32 and the rotating ring 34 at respective ends on the upstream side in the rotation direction of the dynamic pressure creating grooves 47 and 48. After the rotation speed of the motor 11 (the spin base 10) reaches the dynamic pressure creation speed, therefore, a state where the fixed ring 32 is spaced apart from the lower surface of the rotating ring 34 by 5 to 20 μm is maintained by the dynamic pressure and the static pressure of the clean gas from the gas supply source even if the supply flow rate of the clean gas is reduced. At this time, the space between the fixed ring 32 and the rotating ring 34 is sealed with the clean gas branching off to flow along the outside and the inside in the radial direction of the rotating ring 34 from each of the gas introducing grooves 46. When the rotating shaft 9 and the spin base 10 rotate, therefore, the motor containing space 26 within the cover member 24 can be also cut off from a space outside thereof. Accordingly, it is possible to prevent an external atmosphere including a process liquid component from reaching to the motor 11 arranged within the motor containing space 26 and the other mechanism section and to prevent an atmosphere including particles within the motor containing space 26 from reaching to the wafer W. Moreover, the supply flow rate of the clean gas from the gas supply source is reduced so that the consumption of the clean gas can be reduced, thereby allowing the running cost of the device to be reduced.

Even if the flow rate of the clean gas supplied to each of the gas introducing grooves 46 is extraordinarily reduced because there occurs a failure in a clean gas piping system or a clean gas supply source, for example, while the spin base 10 is being rotated, a state where the fixed ring 32 is spaced apart from the lower surface of the rotating ring 34 is maintained by the dynamic pressure of gas (clean gas supplied at a low flow rate or clean gas remaining in the gas supply path 43) generated between the fixed ring 32 and the rotating ring 34 as the spin base 10 (the rotating ring 34) rotates. Therefore, it is possible to prevent the rotating ring 34 from rotating while coming into contact with the fixed ring 32, prevent the fixed ring 32 and/or the rotating ring 34 from being damaged, and prevent atmospheric contamination with abrasion powder of the fixed ring 32 and/or the rotating ring 34 from being occurred. As a result, if the repair of a faulty portion is completed, the process of the wafer W can be immediately resumed, thereby allowing a down time period (a time period during which the process of the wafer W cannot be performed) by the substrate processing apparatus to be shortened.

Interlocking control for stopping the motor 11 to stop the process of the wafer W may be carried out in response to extraordinary reduction in the supply flow rate of the clean gas. In this case, it takes approximately three seconds from the stop of the driving of the motor 11 to the stop of the rotation of the spin base 10. In the meantime, however, a state where the fixed ring 32 is spaced apart from the lower surface of the rotating ring 34 can be maintained by the dynamic pressure of the gas generated between the fixed ring 32 and the rotating ring 34 as the spin base 10 (the rotating ring 34) rotates. Therefore, the possibilities of causing damage to the fixed ring 32 and/or the rotating ring 34 and atmospheric contamination with abrasion powder are eliminated.

Although the present invention has been described and illustrated in detail, it is clearly understood that the same is by way of illustration and example only and is not to be taken by way of limitation, the spirit and scope of the present invention being limited only by the terms of the appended claims.

Although in the foregoing embodiment, each of the dynamic pressure creating grooves 47 and 48 is formed successively to the gas introducing grooves 46, a dynamic pressure creating groove in an L shape extending outward along the radius of the rotating ring 34 from the inner peripheral surface of the rotating ring 34 and extending while being bent in the circumferential direction (counterclockwise in FIG. 3), and a dynamic pressure creating groove in an L shape extending inward along the radius of the rotating ring 34 from the outer peripheral surface of the rotating ring 34 and extending while being bent in the circumferential direction (counterclockwise in FIG. 3) may be formed on the lower surface of the rotating ring 34. In this case, air current generated in the dynamic pressure creating grooves absorbs both an atmosphere of the motor containing space 26 and the external atmosphere. However, both the atmosphere of the motor containing space 26 and the external atmosphere are not mixed with each other by air current of the clean gas supplied to the gas introducing groove 46.

Figure 4:
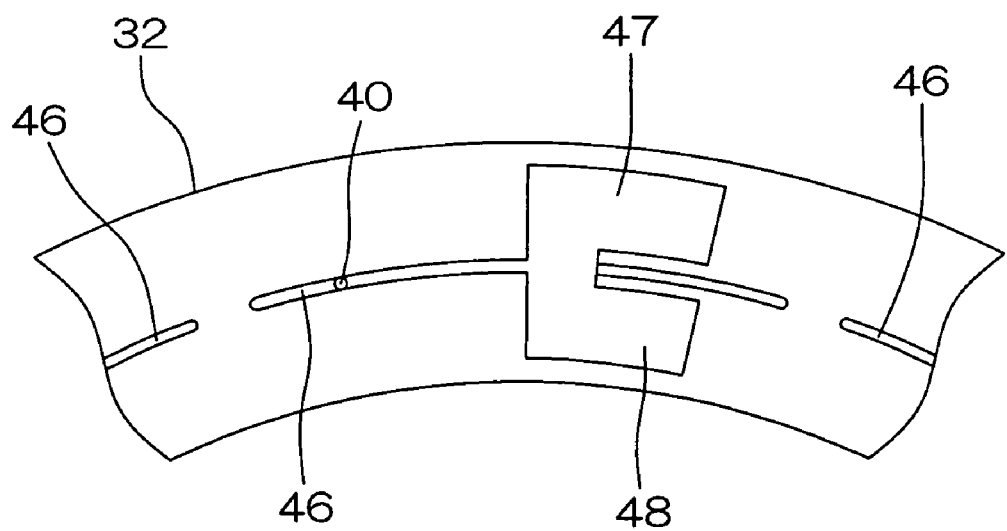
FIG. 4 is a plan view showing a principal part of an upper surface of a fixed ring according to another embodiment (an embodiment in which a gas introducing groove and a dynamic pressure creating groove are formed on the upper surface of the fixed ring) of the present invention.

Furthermore, although the gas introducing groove 46 and the dynamic pressure creating grooves 47 and 48 are formed on the lower surface of the rotating ring 34, both may be formed on the upper surface of the fixed ring 32, as shown in FIG. 4. In this case, the gas introducing groove 46 is formed in a circular arc shape extending along the circumference of the fixed ring 32. The dynamic pressure creating groove 47 is formed in an L shape extending outward along the radius of the fixed ring 32 from a substantially central portion in the longitudinal direction (the circumferential direction) of each of the gas introducing grooves 46 and extending while being bent in the circumferential direction (clockwise in FIG. 4). The dynamic pressure creating groove 48 is formed in an L shape extending inward along the radius of the fixed ring 32 from a central portion in the longitudinal direction (in the circumferential direction) of each of the gas introducing grooves 46 and extending while being bent in the circumferential direction (clockwise in FIG. 4). Each of the dynamic pressure creating grooves 47 and 48 is sloped such that the depth thereof gradually decreases as it moves farther away from its bent portion in the circumferential direction. The opening at the front end of each of the gas vertical paths 40 is arranged within the gas introducing groove 46.

Alternatively, the gas introducing groove 46 and the dynamic pressure creating grooves 47 and 48 may be separately formed on the lower surface of the rotating ring 34 and the upper surface of the fixed ring 32.

Alternatively, one of the dynamic pressure creating groove 47 outside, along the radius of the rotating ring 34, of the gas introducing groove 46 and the dynamic pressure creating groove 48 inside, along the radius of the rotating ring 34, of the gas introducing groove 46 may be omitted.

Alternatively, the gas introducing groove 46 and the dynamic pressure creating grooves 47 and 48 need not be in a groove shape. They may have any shapes, provided that the shapes are concave (a recess). For example, the shapes may be a circular recess or a square recess.

The present application corresponds to an application No. 2004-303417 filed with the Japanese Patent Office on Oct. 18, 2004, the disclosure of which is hereinto incorporated by reference.

What is claimed is:

1. A substrate holding device for holding a substrate and rotating the held substrate, comprising:
   a motor;
   a rotating shaft rotated by the driving force of the motor;
   a spin base coupled to the rotating shaft and rotated integrally with the rotating shaft;
   a cover member surrounding the motor and having its one end arranged in the vicinity of the spin base;

a rotating ring fixed to a surface, opposite to the cover member, of the spin base;

a non-rotatable fixed ring arranged opposite to the rotating ring along the axis of the rotating shaft, the non-rotatable fixed ring having a gas path;

a spring provided at the one end of the cover member for elastically urging the non-rotatable fixed ring toward the rotating ring; and clean gas supply mechanism for supplying clean gas to a space between the rotating ring and the non-rotatable fixed ring, a surface, opposite to the non-rotatable fixed ring, of the rotating ring being formed with a gas introducing recess into which the clean gas is to be introduced by the clean gas supply mechanism, the gas path of the non-rotatable ring being connected to the gas introducing recess to supply gas to the gas introducing recess and to separate the rotating ring from the non-rotatable ring using a static pressure of the supplied gas, the gas introducing recess being a groove extending along a circumference of the rotating ring, and said surface, opposite to the non-rotatable fixed ring, of the rotating ring further being formed with a dynamic pressure creating recess for creating the dynamic pressure of gas between the rotating ring and the non-rotatable fixed ring when the rotating ring rotates;

wherein the gas introducing recess and the dynamic pressure creating recess are continuous with each other.

2. The substrate holding device according to claim 1, wherein
the dynamic pressure creating recess has such a slope that the depth thereof gradually decreases along the circumference of the rotating ring.

3. The substrate holding device according to claim 1, wherein
the clean gas supply mechanism comprises a flow rate adjustment valve for adjusting the supply flow rate of the clean gas, and further comprising
a control section for controlling the opening degree of the flow rate adjustment valve in response to the rotation speed of the motor.

4. The substrate holding device according to claim 3, wherein
the control section opens the flow rate adjustment valve at a relatively high opening degree when the rotation speed of the motor is lower than a predetermined dynamic pressure creation speed, while opening the flow rate adjustment valve at a relatively low opening degree when the rotation speed of the motor is not less than the dynamic pressure creation speed.

5. A substrate processing apparatus comprising:

a substrate holding device for holding a substrate and rotating the held substrate; and a process liquid supply mechanism for supplying a process liquid to the substrate held in the substrate holding device, the substrate holding device comprising:

a motor;

a rotating shaft rotated by the driving force of the motor;

a spin base coupled to the rotating shaft and rotated integrally with the rotating shaft;

a cover member surrounding the motor and having its one end arranged in the vicinity of the spin base;

a rotating ring fixed to a surface, opposite to the cover member, of the spin base;

a non-rotatable fixed ring arranged opposite to the rotating ring along the axis of the rotating shaft, the non-rotatable fixed ring having a gas path;

a spring provided at the one end of the cover member for elastically urging the non-rotatable fixed ring toward the rotating ring; and clean gas supply mechanism for supplying clean gas to a space between the rotating ring and the non-rotatable fixed ring, a surface, opposite to the non-rotatable fixed ring, of the rotating ring being formed with a gas introducing recess into which the clean gas is to be introduced by the clean gas supply mechanism, the gas path of the non-rotatable ring being connected to the gas introducing recess to supply gas to the gas introducing recess and to separate the rotating ring from the non-rotatable ring using a static pressure of the supplied gas, the gas introducing recess being a groove extending along a circumference of the rotating ring, and said surface, opposite to the non-rotatable fixed ring, of the rotating ring further being formed with a dynamic pressure creating recess for creating the dynamic pressure of the gas between the rotating ring and the non-rotatable fixed ring when the rotating ring rotates;

wherein the gas introducing recess and the dynamic pressure creating recess are continuous with each other.

* * * * *